(12) United States Patent
Nagakubo

(10) Patent No.: US 8,280,662 B2
(45) Date of Patent: Oct. 2, 2012

(54) OPTICAL SYSTEM, OPTICAL MODULE AND THRESHOLD SETTING METHOD

(75) Inventor: Yasunori Nagakubo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 849 days.

(21) Appl. No.: 12/260,150

(22) Filed: Oct. 29, 2008

(65) Prior Publication Data

US 2009/0164158 A1 Jun. 25, 2009

(30) Foreign Application Priority Data

Dec. 21, 2007 (JP) ................................. 2007-330255

(51) Int. Cl.
*G01R 13/00* (2006.01)
*G06F 11/30* (2006.01)
(52) U.S. Cl. ............... 702/66; 702/67; 702/69; 702/183
(58) Field of Classification Search .............. 702/66–77, 702/182–190
See application file for complete search history.

(56) References Cited

U.S. PATENT DOCUMENTS 6,882,944 B2 * 4/2005 Fujisaku ........................ 702/66

FOREIGN PATENT DOCUMENTS

| JP | 2000-134160 | * | 5/2000 |
| JP | 2004-15587 | | 1/2004 |

OTHER PUBLICATIONS

Japanese Patent Office Notification of Reasons for Refusal mailed Jan. 17, 2012, for corresponding Japanese Patent Application No. 2007-330255.

* cited by examiner

*Primary Examiner* — Phuong Huynh
(74) *Attorney, Agent, or Firm* — Staas & Halsey LLP

(57) ABSTRACT

An optical system includes an optical module having an optical reception unit that receives input light and output an electric signal related to received input light, and a processing unit having an identification unit that performs identification processing based on a threshold value on the electric signal input via a reception signal path from the optical reception unit. The optical module includes a threshold calculation unit that calculates the threshold value based on the electric signal from the optical reception unit and a signal path characteristic of the reception signal path from the optical reception unit to the identification unit, and the identification unit of the processing unit performs the identification processing based on the threshold value calculated by the threshold calculation unit. Thereby, the threshold value is optimized when the identifier is provided in the unit as a connection destination of the optical module.

16 Claims, 9 Drawing Sheets

OPTICAL SYSTEM, OPTICAL MODULE AND THRESHOLD SETTING METHOD

CROSS-REFERENCE TO RELATED APPLICATION(S)

This application is based upon and claims the benefit of priority of the prior Japanese Application No. 2007-330255, filed on Dec. 21, 2007 in Japan, the entire contents of which are hereby incorporated by reference.

FIELD

The embodiment(s) discussed herein relates to an optical system, an optical module and a threshold setting method.

BACKGROUND

Currently, optical fiber signal transmission is essential for configuration of a social infrastructure. For optical transmitters and receivers used in the optical fiber signal transmission, developments compliant with MSA (Multi-source Agreement) as a standard specification is centered for the purpose of stable supply of signals. Recently, developments based on a standard specification of SFP+ in MSA have been started in respective companies. In SFP+, although the speed of the main signal is as fast as 10 Gbps, no identifier for discrimination of data codes with respect to reception signals is contained within an optical module.

Accordingly, in SFP+, it is necessary to provide the above described identifier outside of the optical module, specifically on a unit as a connection destination of the optical module.

By the way, transmission characteristics such as dispersion characteristics and noise characteristics of an optical path connected to the optical module have an impact on the waveform of a reception signal input to the identifier. On the other hand, quality characteristics of the reception signal obtained as an identification result largely depend on the threshold setting of the identifier.

Japanese Laid-open Patent Publication No. 2004-15587 discloses a technology, in order to improve the quality characteristic of the reception signal, of calculating a threshold value from the output waveform of an amplifier of a receiver with a peak detector, a DC detector, and a bottom detector for optimization of the threshold value of an identifier.

However, the conventional technology does not consider optimization of the threshold value when an identifier is provided on a unit as a connection destination of the optical module.

SUMMARY

Accordingly, it is an object of the embodiment to optimize the threshold value when an identifier is provided on a unit as a connection destination of the optical module.

According to an aspect of the embodiment, an optical system includes a requirement of including an optical module having an optical reception unit that receives input light and output as an electric signal related to received input light, and a processing unit having an identification unit that performs identification processing based on a threshold value on the electric signal input via a reception signal path from the optical reception unit, wherein the optical module includes a threshold calculation unit that calculates the threshold value based on the electric signal from the optical reception unit and a signal path characteristic of the reception signal path from the optical reception unit to the identification unit, and the identification unit of the processing unit performs the identification processing based on the threshold value calculated by the threshold calculation unit.

Further, an optical module in an optical system including an optical module and a processing unit connected to the optical module has a requirement of including an optical reception unit that receives input light and output as an electric signal related to received input light, and a threshold calculation unit that calculates the threshold value for identification processing based on the electric signal from the optical reception unit and a signal path characteristic between the optical module and the processing unit.

Further, a threshold setting method in an optical system including an optical module having an optical reception unit that receives input light and output an electric signal related to received input light, and a processing unit having an identification unit that performs identification processing on the electric signal from the optical reception unit based on a threshold value, the threshold setting method has a requirement of including detecting a characteristic of the electric signal from the optical reception unit in the optical module, acquiring a signal path characteristic of the electric signal from the optical reception unit to the identification unit, and calculating the threshold value for identification processing in the identification unit based on the detected characteristic of the electric signal and the acquired signal path characteristic.

Additional objects and advantages of the invention (embodiment) will be set forth in part in the description which follows, and in part will be obvious from the description, or may be learned by practice of the invention. The object and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE PREFERRED EMBODIMENTS

Hereinafter, embodiments of the present invention will be described with reference to the drawings.

[A] Description of the First Embodiment

Figure 1:
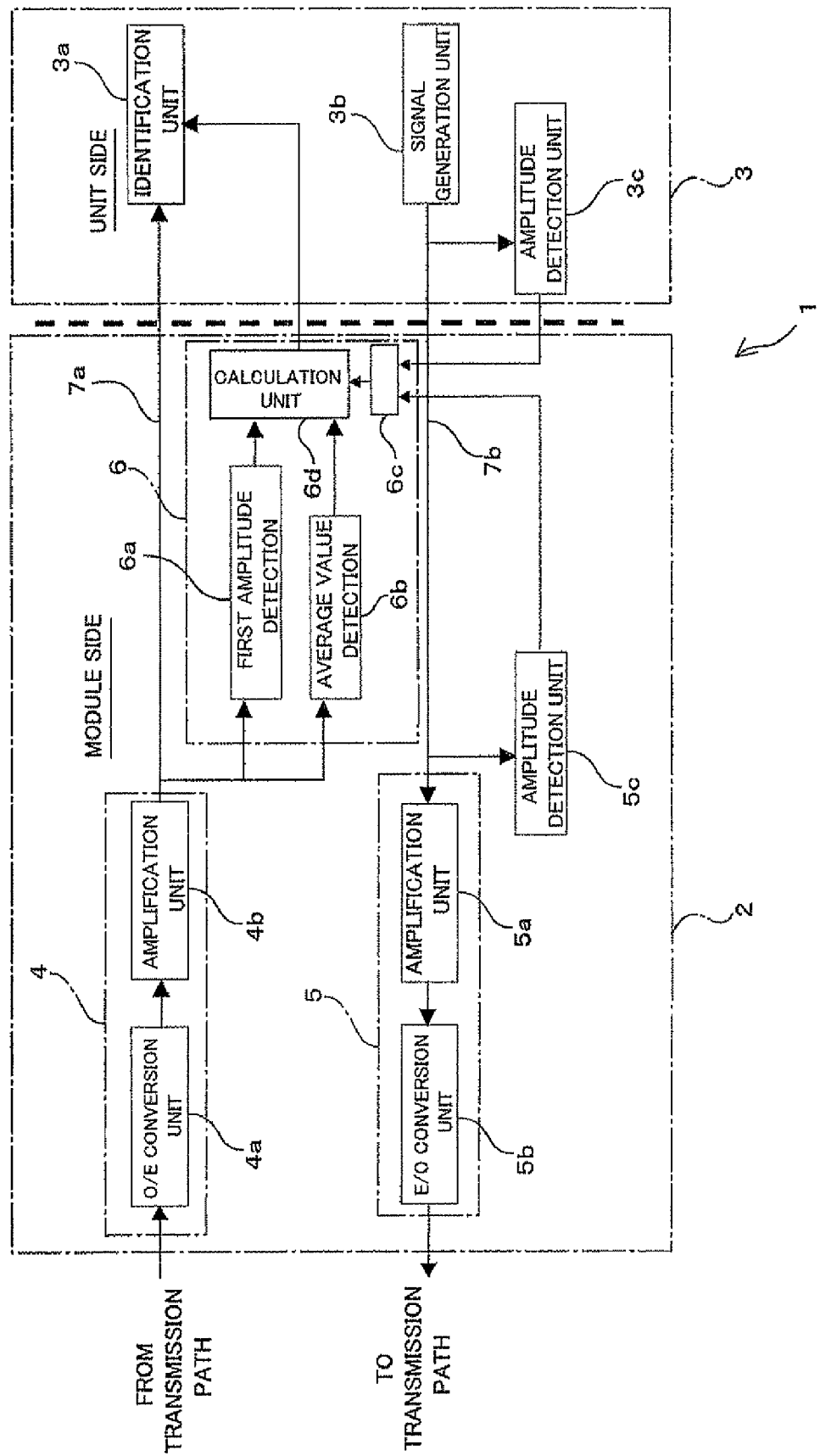
FIG. 1 illustrates an optical system according to the first embodiment.

FIG. 1 illustrates an optical system 1 according to the first embodiment. The optical system 1 illustrated in FIG. 1 includes an optical transmission and reception module (optical module) 2 and a processing unit 3 connected to the optical transmission and reception module 2. The optical transmission and reception module 2 has specifications according to SFP+ (Small Form-Factor Pluggable+) of MSA, for example, and includes an optical reception unit 4, an optical transmission unit 5, an amplitude detection unit 5c and a threshold calculation unit 6. On the other hand, the processing unit 3 includes an identifier (identification unit) 3a for identifying data codes of electric signals from the optical reception unit 4 and a signal generator (transmission signal generation unit) 3b for generating signals (transmission electric signals) to the optical transmission unit 5.

The optical reception unit 4 can receive optical signals transmitted through a transmission path (not shown) and output them as electric signals, and includes an optical-to-electric (O/E) conversion unit 4a and an amplification unit 4b. The optical-to-electric conversion unit 4a converts optical signals input through the transmission path into electric signals. The amplification unit 4b amplifies the electric signals from the optical-to-electric conversion unit 4a and converts them.

Further, the optical transmission unit 5 converts the transmission electric signals from the signal generation unit 3b of the processing unit 3 into optical signals and outputs them through a transmission path (not shown), and includes an amplification unit 5a and an electric-to-optical (E/O) conversion unit 5b. The amplification unit 5a amplifies the transmission electric signals input from the processing unit 3. The electric-to-optical conversion unit 5b converts the transmission electric signals from the amplification unit 5a into optical signals and transmits them as transmission optical signals through a transmission path (not shown).

The amplification unit 4b of the optical reception unit 4 forming the optical transmission and reception module 2 and the identifier 3a of the processing unit 3 are connected via a reception signal path 7a formed by the connection between the optical transmission and reception module 2 and the processing unit 3. Similarly, the signal generation unit 3b of the processing unit 3 and the amplification unit 5a of the optical transmission unit 5 forming the optical transmission and reception module 2 are connected via a transmission signal path 7b formed by the connection between the optical transmission and reception module 2 and the processing unit 3.

Further, the threshold calculation unit 6 of the optical transmission and reception module 2 calculates a threshold for identification processing in the identification unit 3a based on the characteristics of the reception signal path 7a of the electric signals from the optical reception unit 4 and the electric signals from the optical reception unit 4 to the identification unit 3a forming the processing unit 3, and includes a first amplitude detection unit 6a, an average value detection unit 6b, a signal path characteristic acquisition unit 6c, and a calculation unit 6d. In the embodiment, a value obtained as the signal characteristic of the transmission signal path 7b is estimated as the signal path characteristic of the reception signal path 7a as described below.

Figure 2:
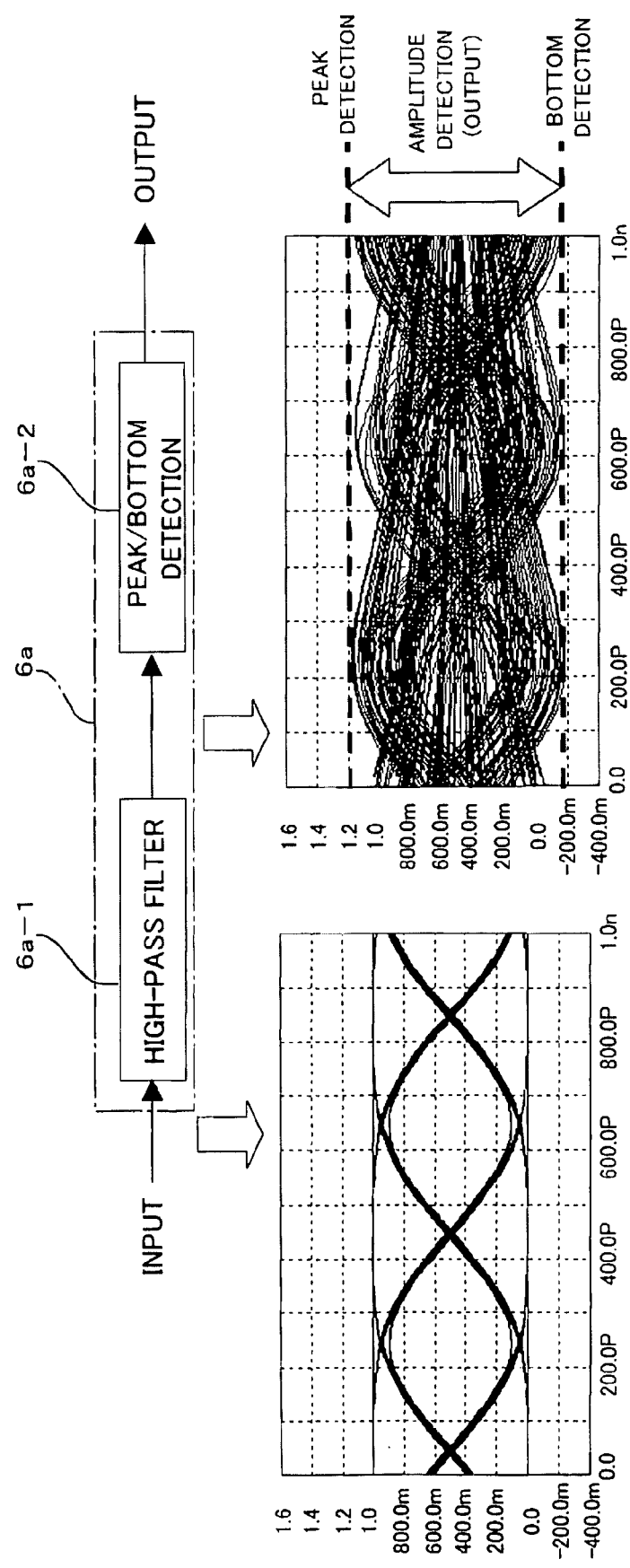
FIG. 2 illustrates an amplitude detection unit of an optical transmission and reception module according to the first embodiment.

Here, the first amplitude detection unit 6a detects peak value/bottom value of the electric signal from the optical reception unit 4 as values indicating a substantial amplitude value of the electric signal from the optical reception unit 4, and includes a high-pass filter 6a-1 and a peak/bottom detection circuit 6a-2 as illustrated in FIG. 2.

The high-pass filter 6a-1 removes a direct-current component with respect to the electric signal from the optical reception unit 4. The peak/bottom detection circuit 6a-2 detects peak/bottom with respect to the electric signal from which the direct-current component has been removed by the high-pass filter 6a-1. The amplitude value is derived as a substantial difference between the above described peak value and bottom value. Thus detected peak value and bottom value is output to the calculation unit 6d at the downstream.

Further, the average value detection unit 6b detects the direct-current component included in the electric signal from the optical reception unit 4 by detecting the average value of the electric signal from the optical reception unit 4.

Furthermore, the signal path characteristic acquisition unit 6c obtains the characteristic of the transmission signal path 7b by calculation, and outputs the value of the signal path characteristic as a calculation result to the calculation unit 6d as an estimated value of the signal path characteristic of the reception signal path 7a. The above described signal path characteristic may be a value of, for example, a ratio Z/Y of the amplitude value Z of the electric signal when the signal is input to the optical transmission unit 5 to the amplitude value Y of the electric signal output from the signal generation unit 3b, or the inverse ratio Y/Z.

Here, the processing unit 3 includes an amplitude detection unit (a third amplitude detection unit) 3c that detects the amplitude value Y of the transmission electric signal output from the signal generation unit 3b and outputs a detection result to the signal path characteristic acquisition unit 6c through a control signal line or the like, for example. On the other hand, the optical transmission and reception module 2 includes an amplitude detection unit (a fourth amplitude detection unit) 5c that detects the amplitude value Z of the transmission electric signal input to the electric-to-optical conversion unit 5b and outputs a detection result to the signal path characteristic acquisition unit 6c.

Thereby, in the signal path characteristic acquisition unit 6c, the amplitude ratio (Z/Y or Y/Z) as the signal path characteristic can be obtained based on the detection results from the above described amplitude detection units 3c and 5c.

In the first embodiment, it is assumed that the loss characteristics due to signal transmission in the reception signal path 7a and the transmission signal path 7b are equal, and the change characteristic of the signal amplitude value after transmission (the amplitude value when the signal is input to the amplification unit 5a of the optical transmission unit 5) relative to the signal amplitude value before transmission of the transmission signal path 7b (the amplitude value of the electric signal output from the signal generator 3b) is estimated as the characteristic of the reception signal path 7a.

That is, in the SFP+ or the like in which the optical module is integrally configured by the transmission unit and the reception unit, it can be assumed that the transmission losses of the reception signal path 7a between the optical reception unit 4 and the identification unit 3a and the transmission signal path 7b between the signal generation unit 3b and the optical transmission unit 5 are substantially equal. Accordingly, the optimal threshold is provided from the optical transmission and reception module 2 side to the processing unit 3 side by offsetting the threshold value calculated from the peak detection value/bottom detection value and the average detection value with the signal path losses calculated by the amplitude detection units 3c and 5c. Thereby, the necessity to monitor the signal itself in the reception signal path 7a can be reduced and the waveform degradation of the input by monitoring to the identification unit 3a can be suppressed.

Further, the calculation unit 6d calculates the threshold value using the identifier 3a forming the processing unit 3 based on the above described peak value/bottom value detected by the first amplitude detection unit 6a, average value detected by the average value detection unit 6b, and signal path characteristic acquired by the signal path characteristic acquisition unit 6c. That is, unlike the technology described in the above described Japanese Laid-Open Patent Publication No. 2004-15587, the threshold value is calculated using not only the peak value/bottom value and the average value but also the signal path characteristic calculated by the signal path characteristic acquisition unit 6c.

In the SFP+ adopted to the specification of the optical transmission and reception module 2, the module configuration has no identifier within, and accordingly, the processing unit 3, which is configured separately from the optical transmission and reception module 2, includes the identifier 3a. In this case, the length of the reception signal path 7a between the optical reception unit 4 and the identifier 3a is envisioned to become longer than that in the case where the identifier is provided within the transmission and reception module.

That is, in the process that the reception signal output from the optical reception unit 4 reaches the identifier 3a through the reception signal path 7a, the degradation of the signal waveform is assumed. However, the waveform degradation due to propagation through the reception signal path 7a is not considered in the threshold value determined according to the peak value/bottom value and the average value of the reception signals at the upstream propagating through the reception signal path 7a. Thus, if the threshold value is calculated based on these peak value/bottom value and average value, the threshold value is not necessarily optimal as the threshold value for the input signal to the identifier 3a provided outside of the optical transmission and reception module 2.

On the other hand, when the processing unit 3 includes the identifier 3a, it is conceivable that the function of calculating the threshold value at the upstream of the identifier 3a within the processing unit 3 for eliminating the need to consider the degradation of the reception signal path 7a. However, it is desirable that the threshold calculation is obtained from measurement values at points at which good signal quality is estimated at the upstream of the propagation of the reception signal path 7a.

Further, the transmission characteristics such as dispersion characteristics and noise characteristics of an optical transmission path (not shown) connected to the optical transmission and reception module 2 having an impact on the transmission waveform of the reception signal input received by the optical transmission and reception module 2 vary depending on the connected optical transmission and reception module 2 as viewed from the processing unit 3 side.

Even if the threshold value is calculated based on these peak value/bottom value and average value as described above, weighting for the calculation of the threshold value is generally derived from the above described transmission characteristics. In the processing unit 3, it is difficult to derive weighting based on the external circumstances as described above, and accordingly, unambiguous calculation of the threshold value by the input of the identifier 3a is not the most appropriate method.

In the first embodiment, the characteristic of the reception signal path 7a is acquired in the signal path characteristic acquisition unit 6c of the threshold calculation unit 6 forming the optical transmission and reception module 2, weighting is provided using the peak value/bottom value and average value with the acquired signal path characteristic according to the transmission path characteristic, and thereby, the optimal threshold value for identification processing in the identifier 3a provided in the processing unit 3 can be calculated.

The following equation (1) is an example of a derivation equation of the threshold value calculated in the calculation unit 6d. In the equation (1), Y is an amplitude value detected by the amplitude detection unit 3c and Z is an amplitude value detected by the amplitude detection unit 5c. In this case, the value of the signal path characteristic acquired by the signal path characteristic acquisition unit 6c is assumed to be Y/Z.

Furthermore, P and B are a peak value and a bottom value of a reception signal detected by the first amplitude detection unit 6a, respectively, and A is an average value detected by the calculation unit 6d. k is a weighting factor according to the transmission characteristics such as dispersion characteristics and noise characteristics of an optical transmission path (not shown) connected to the optical transmission and reception module 2, and M is a weighting factor depending on the characteristic of the reception signal path 7a or the like. The weighting factors k, M can be held in the calculation unit 6d in advance.

$$\text{Threshold value} = A + (P-B) \times k + (Y/Z) \times M \quad (1)$$

As expressed by the above equation (1), in the optical transmission and reception module 2, when the processing unit 3 includes the identifier 3a, the optimal threshold value can be derived in consideration of the characteristic of the reception signal path 7a. In other words, the value formed by offsetting the value calculated using the weighting factors according to the transmission characteristics such as dispersion characteristics and noise characteristics of an optical transmission path (not shown) as well as the peak value, bottom value and average value with the value according to the characteristic of the reception signal path 7a is used as the threshold value.

Figure 3:
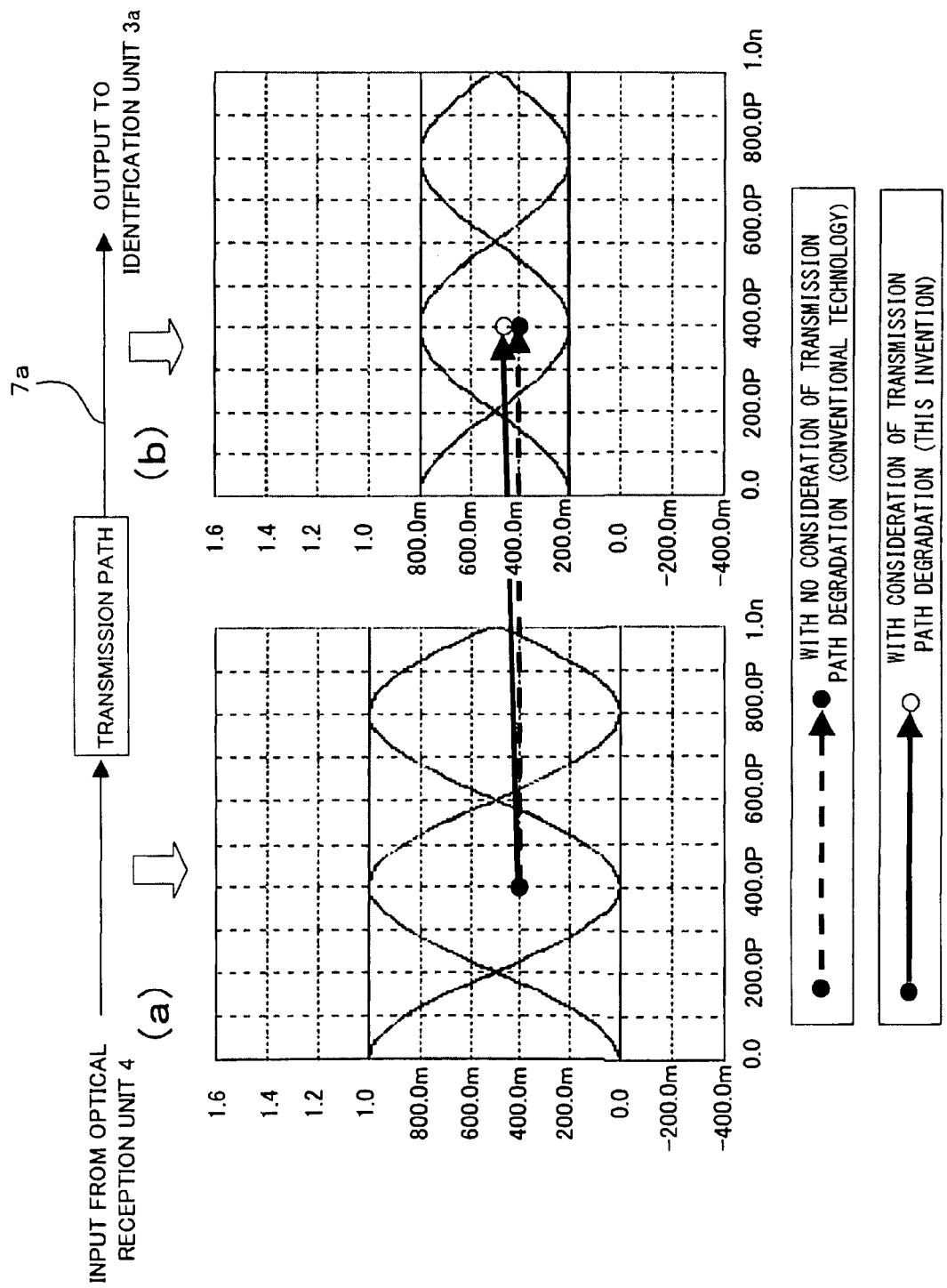
FIG. 3 illustrates an effect of the optical system according to the first embodiment.

FIG. 3 illustrates an eye pattern (a) of a reception signal at the output point of the optical reception unit 4 and an eye pattern (b) of a reception signal at the input point of the identifier 3a in the optical system 1 configured as described above, and a comparison example between a threshold value (white circle) calculated by the threshold calculation unit 6 of the optical transmission and reception module 2 in consideration of the characteristic of the reception signal path 7a and a threshold value (black circle) calculated with no consideration of the characteristic of the reception signal path 7a (without adding the value of (Y/Z)×M in the equation (1)).

As illustrated in FIG. 3, the reception electric signal output from the optical reception unit 4 has a small amplitude when propagating the reception signal path 7a and being input to the identification unit 3a. In this regard, the threshold value (white circle) calculated by the threshold calculation unit 6 in consideration of the characteristic of the reception signal path 7a is made closer to the center of the eye aperture of the reception electric signal input to the identification unit 3a than that of the case where the above described threshold value (black circle) calculated with no consideration of the degradation at the optical transmission and reception module 2 side.

For instance, the case where the optimal threshold value in the identification unit 3a is 40% of the amplitude and has 40% of amplitude degradation due to the reception signal path 7a is assumed. The amplitude before transmission is A and the amplitude after transmission is B. Regarding the threshold value before transmission, given that the deviation from the center of A (the intermediate level of the amplitude A) is ΔA, ΔA=A×0.1. That is, when the degradation of the reception signal path 7a is not considered, the value at the 40% level of the amplitude value A is calculated as the threshold value.

Therefore, the relationship between A and B is B/A=0.6, and the threshold value is calculated to be 33% (=50%−0.1/0.6) from the amplitude relational expression at input to the identification unit 3a. In the first embodiment, the threshold value calculated in the threshold calculation unit 6 is corrected by B/A=0.6 compared to that in the above described case to be 40% (50%−0.1/0.6×0.6), and thus, the optimal threshold value can be obtained.

According to the above described configuration, in the optical system 1 of the first embodiment, the characteristic of the electric signal from the optical reception unit 4 is detected in the first amplitude detection unit 6a and the average value detection unit 6b forming the threshold calculation unit 6 of the optical transmission and reception module 2, the signal path characteristic of the electric signal from the optical reception unit 4 to the identification unit 3a is acquired in the signal path characteristic acquisition unit 6c, and the threshold value for identification processing in the identification unit 3a is calculated based on the detected characteristics of the electric signal and the acquired signal path characteristic in the calculation unit 6d.

In the configuration of the related art with the identifier provided at the optical module side, since the processing unit is connected through DATA/CLK with low noise identified by the identifier within the optical module, not so much consideration is necessary for the degradation elements of the signal path between the module side and the unit side. However, in the case where a configuration in which an optical reception module and an optical transmission module are integrally formed and no identifier is contained at the module side for reduction of the price is assumed as in SFP+, the output of the optical reception unit (see sign 4 in FIG. 1) is input to the identification unit 3a of the processing unit 3 side without change. Accordingly, the module 2 side and the unit 3 side are connected only by DATA with high noise and it is necessary to sufficiently consider the signal path between them and provide threshold information to the identification unit 3a. In the first embodiment, as described above, according to the first embodiment, by the threshold calculation unit 6, there is an advantage that the threshold value when the unit 3 as the connection destination of the optical transmission and reception module 2 includes the identification unit 3a can be optimized.

[b] Description of the Second Embodiment

Figure 4:
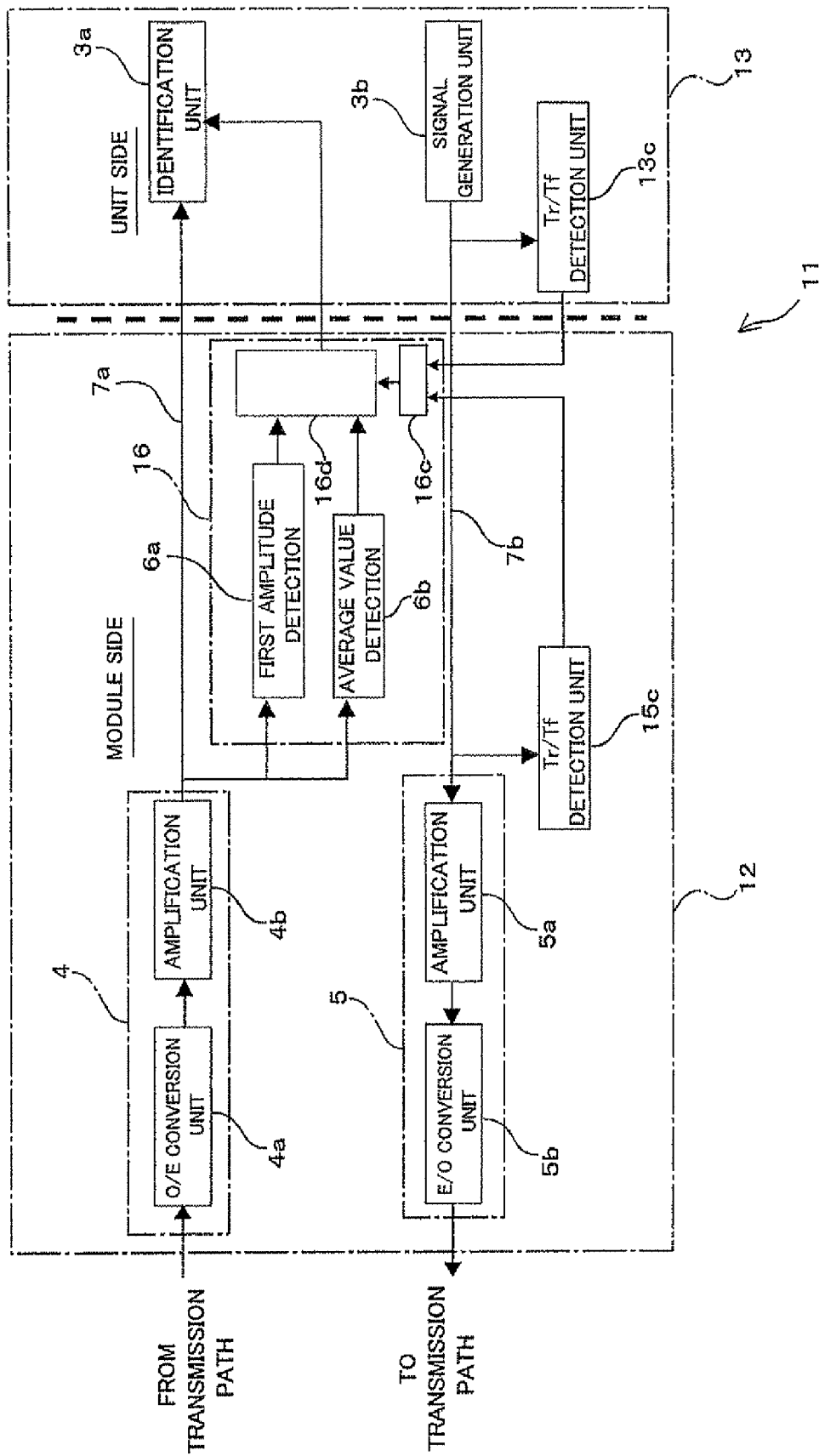
FIG. 4 illustrates an optical system according to the second embodiment.

FIG. 4 illustrates an optical system 11 according to the second embodiment. The optical system 11 illustrated in FIG. 4 includes an optical transmission and reception module 12 and a processing unit 13 different from those of the above described first embodiment. The optical transmission and reception module 12 includes a Tr/Tf detection unit 15c and a threshold calculation unit 16 unlike the optical transmission and reception module 2 illustrated in FIG. 1, and the processing unit 13 includes a Tr/Tf detection unit 13c different from that of the processing unit 3 illustrated in FIG. 1. In FIG. 4, the same signs denote nearly the same parts as those in FIG. 1.

The Tr/Tf detection unit (the third rise and fall time detection unit) 13c of the processing unit 13 detects the rise and fall time of the transmission electric signal (main signal) generated in the signal generation unit (transmission signal generation unit) 3b, i.e., Tr/Tf, and a detection result is output to a signal path characteristic acquisition unit 16c forming the threshold calculation unit 16, which will be described later. Further, a Tr/Tf detection unit (a fourth rise and fall time detection unit) 15c detects the rise and fall time of the transmission electric signal (main signal) input to the optical transmission unit 5, and a detection result is output to the signal path characteristic acquisition unit 16c forming the threshold calculation unit 16, which will be described later.

Figure 5:
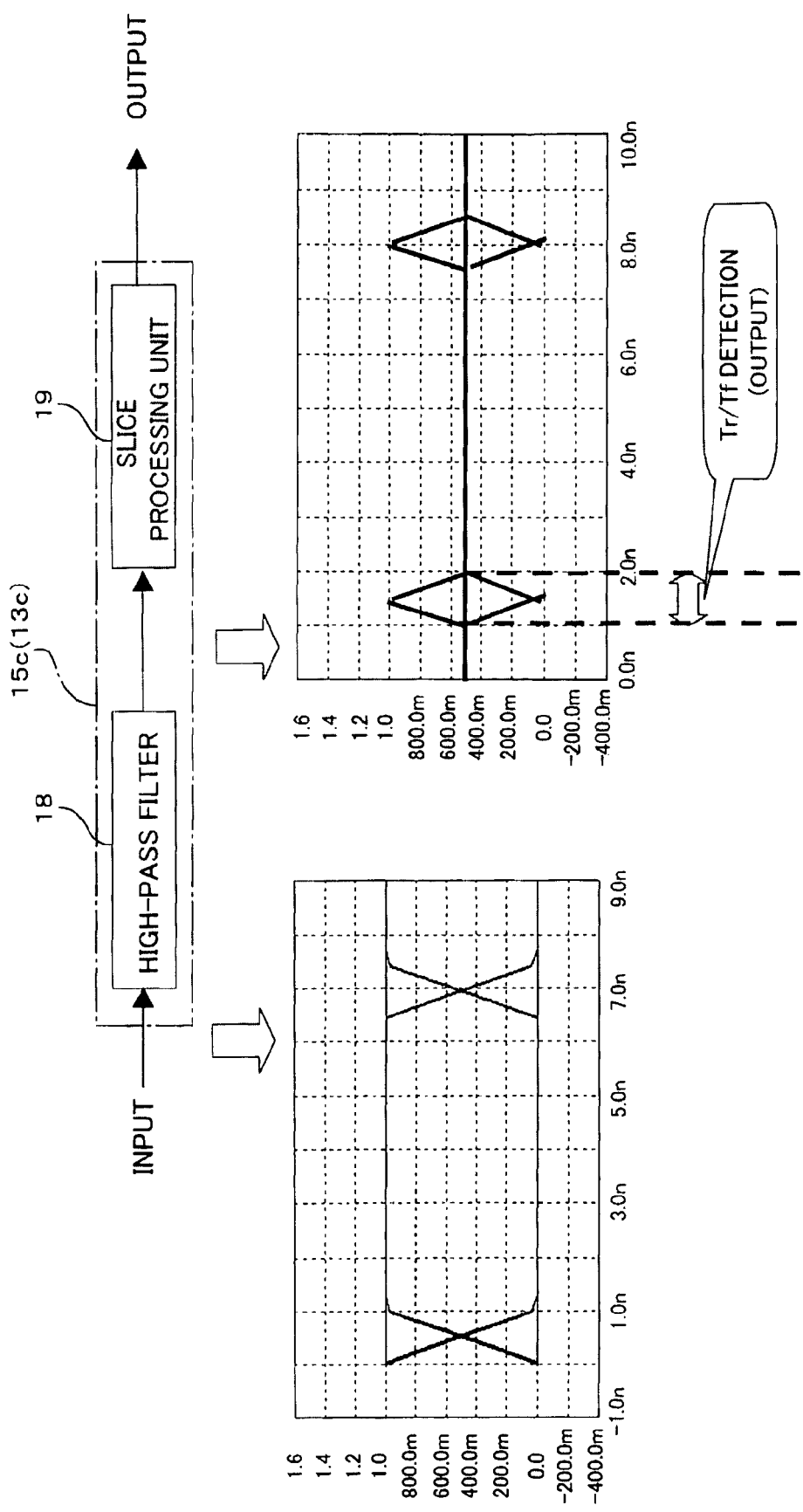
FIG. 5 illustrates a Tr/Tf detection unit of an optical transmission and reception module according to the second embodiment.

The above described Tr/Tf detection units 13c and 15c each includes a high-pass filter 18 and a slice processing unit 19, for example, as illustrated in the FIG. 5. The high-pass filter 18 is a filter having a relatively high cut-off frequency for the input signal, and, when the input signal is passed through the high-pass filter 18, a waveform component for detecting Tr/Tf time can be extracted. The input signal for the Tr/Tf detection unit 13c is a transmission electric signal from the transmission signal generation unit 3b and the input signal for the Tr/Tf detection unit 15c is a transmission electric signal when propagating the transmission signal path 7b and being input to the optical transmission unit 5. Further, the slice processing unit 19 slices the signal the waveform of which has been extracted by the high-pass filter 18 nearly at the Low level, and the signal resulting from the slice processing may be a signal having Tr/Tf information.

The detection results from the above described Tr/Tf detection units 13c and 15c are input to the signal path characteristic acquisition unit 16c, and the signal path characteristic of the reception signal path 7a can be acquired by the calculation based on the detection results. The above described signal path characteristic may be a value of a ratio Z2/Y2 of Tr/Tf time Z2 of the electric signal when the signal is input to the optical transmission unit 5 to the Tr/Tf time Y1 of the electric signal output from the signal generation unit 3b, or the inverse ratio Y2/Z2.

As is the case of the first embodiment, it is assumed that the loss characteristics due to signal transmission in the reception signal path 7a and the transmission signal path 7b are equal, and the change characteristic of the Tr/Tf time after transmission (the Tr/Tf time of the electric signal when the signal is input to the amplification unit 5a of the optical transmission unit 5) relative to the Tr/Tf time before transmission of the transmission signal path 7b (the Tr/Tf time of the electric signal output from the signal generator 3b) is estimated as the characteristic of the reception signal path 7a.

Thereby, the calculation unit 16d forming the threshold calculation unit 16 calculates the threshold value using the identifier 3a forming the processing unit 3 according to the above described equation (1) based on the above described peak value/bottom value detected by the first amplitude detection unit 6a, average value detected by the average value detection unit 6b, and signal path characteristic acquired by the signal path characteristic acquisition unit 16c. Since the signal path characteristic acquired by the signal path characteristic acquisition unit 16c is based on the Tr/Tf time unlike the case of the first embodiment, and adjustment according to the characteristic value can be appropriately provided to the weighting factor M.

Also, in thus configured optical system 11 according to the second embodiment, there is an advantage that the threshold value when the unit 13 as the connection destination of the optical transmission and reception module 12 includes the identification unit 3a by the threshold calculation unit 16 can be optimized.

[c] Description of the Third Embodiment

Figure 6:
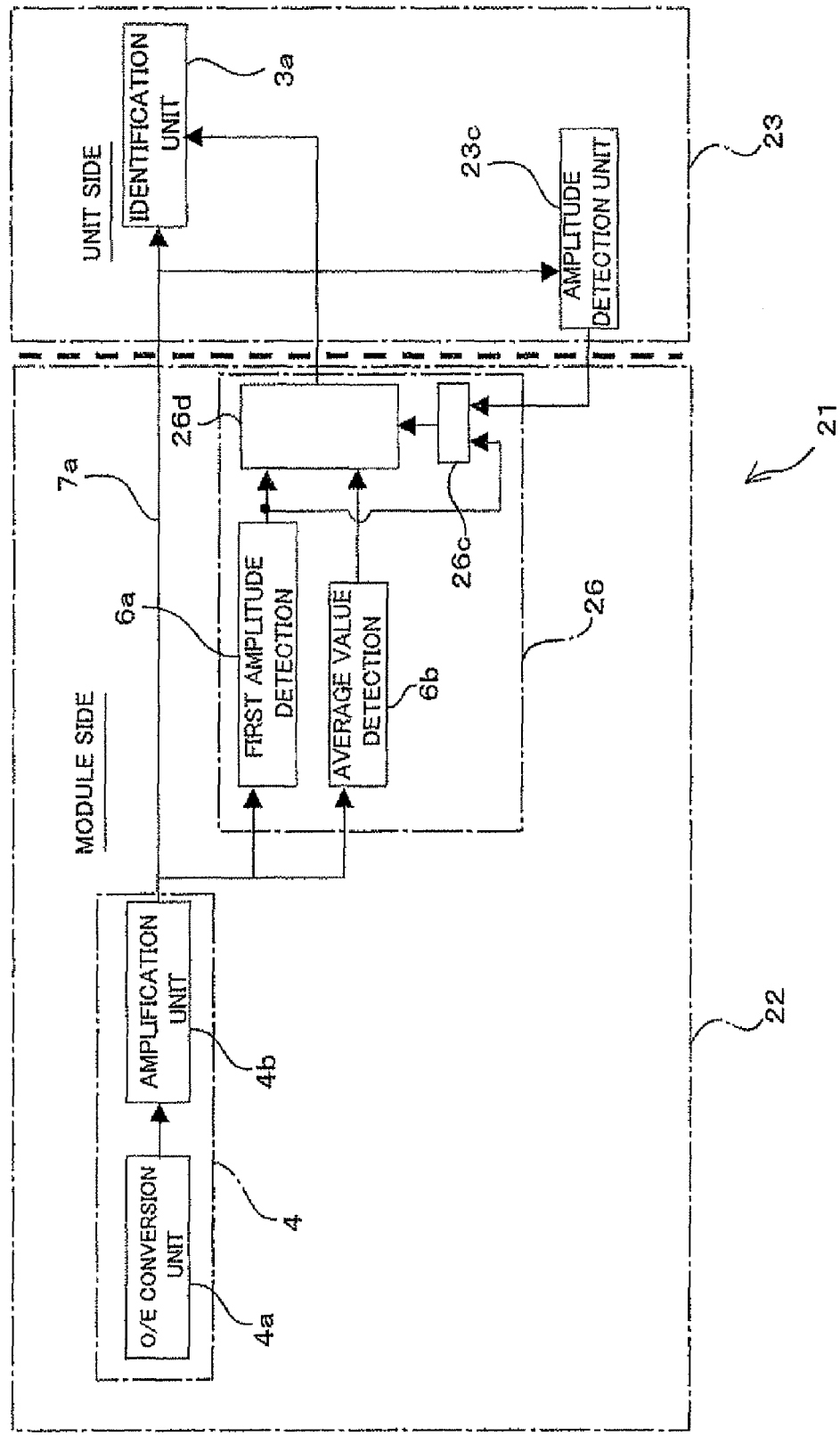
FIG. 6 illustrates an optical system according to the third embodiment.

FIG. 6 illustrates an optical system 21 according to the third embodiment. The optical system 21 illustrated in FIG. 6 includes an optical module 22 and a processing unit 23 different from those of the above described first embodiment. The optical module 22 is configured as an optical reception module including the same optical reception unit 4 as that illustrated in FIG. 1 and a threshold calculation unit 26 different from that (see sign 6) illustrated in FIG. 1. An optical transmission and reception module may be configured by including the optical transmission unit 5 illustrated in FIG. 1.

The threshold calculation unit 26 includes the same first amplitude detection unit 6a and the average value detection unit 6b as those in the above described first and second embodiments, and includes a signal path characteristic acquisition unit 26c and a calculation unit 26d different from those in the above described first and second embodiments. The signal path characteristic acquisition unit 26c acquires a signal path characteristic of the reception signal path 7a by direct calculation. The calculation unit 26d calculates the threshold value to be used in the identification unit 3a based on the above described peak value/bottom value detected by the first amplitude detection unit 6a, average value detected by the average value detection unit 6b, and signal path characteristic acquired by the signal path characteristic acquisition unit 26c.

Further, the processing unit 23 includes the same identification unit 3a as that illustrated in FIG. 1 and an amplitude detection unit 23c different from that (see sign 3c) illustrated in FIG. 1. The signal generation unit 3b illustrated in FIG. 1 may be provided and, in this case, the transmission electric signal from the signal generation unit 3b is input to the optical transmission unit 5 via the transmission signal path 7b (see FIG. 1). In FIG. 6, the same signs as those in FIG. 1 denote nearly the same parts.

Here, the amplitude detection unit (the second amplitude detection unit) 23c detects the amplitude of the reception electric signal propagated through the reception signal path 7a input to the identification unit 3a, and the detection result is output to the signal path characteristic acquisition unit 26c forming the threshold calculation unit 26 of the optical module 22, which will be described later.

In the signal path characteristic acquisition unit 26c, the ratio of the amplitude value of the output electric signal from the optical reception unit 4 and the amplitude value of the amplitude detection unit 23c specified by the difference between the peak value and the bottom value from the above described first amplitude detection unit 6a is directly derived as the signal path characteristic of the reception signal path 7a. In other words, the signal path characteristic acquisition unit 26c acquires the signal path characteristic by the calculation based on the detection results in the first and second amplitude detection units 6a and 23c.

Thereby, the calculation unit 26d calculates the threshold value using the identifier 3a forming the processing unit 3 according to the above described equation (1) based on the above described peak value/bottom value detected by the first amplitude detection unit 6a, average value detected by the average value detection unit 6b, and signal path characteristic acquired by the signal path characteristic acquisition unit 26c. Since the signal path characteristic acquired by the signal path characteristic acquisition unit 26c is directly based on the reception signal path 7a unlike the case of the first embodiment, and adjustment according to the characteristic value can be appropriately provided to the weighting factor M.

Also, in thus configured optical system 21 according to the third embodiment, there is an advantage that the threshold value when the unit 23 as the connection destination of the optical module 22 includes the identification unit 3a by the threshold calculation unit 26 can be optimized.

[d] Description of the Fourth Embodiment

Figure 7:
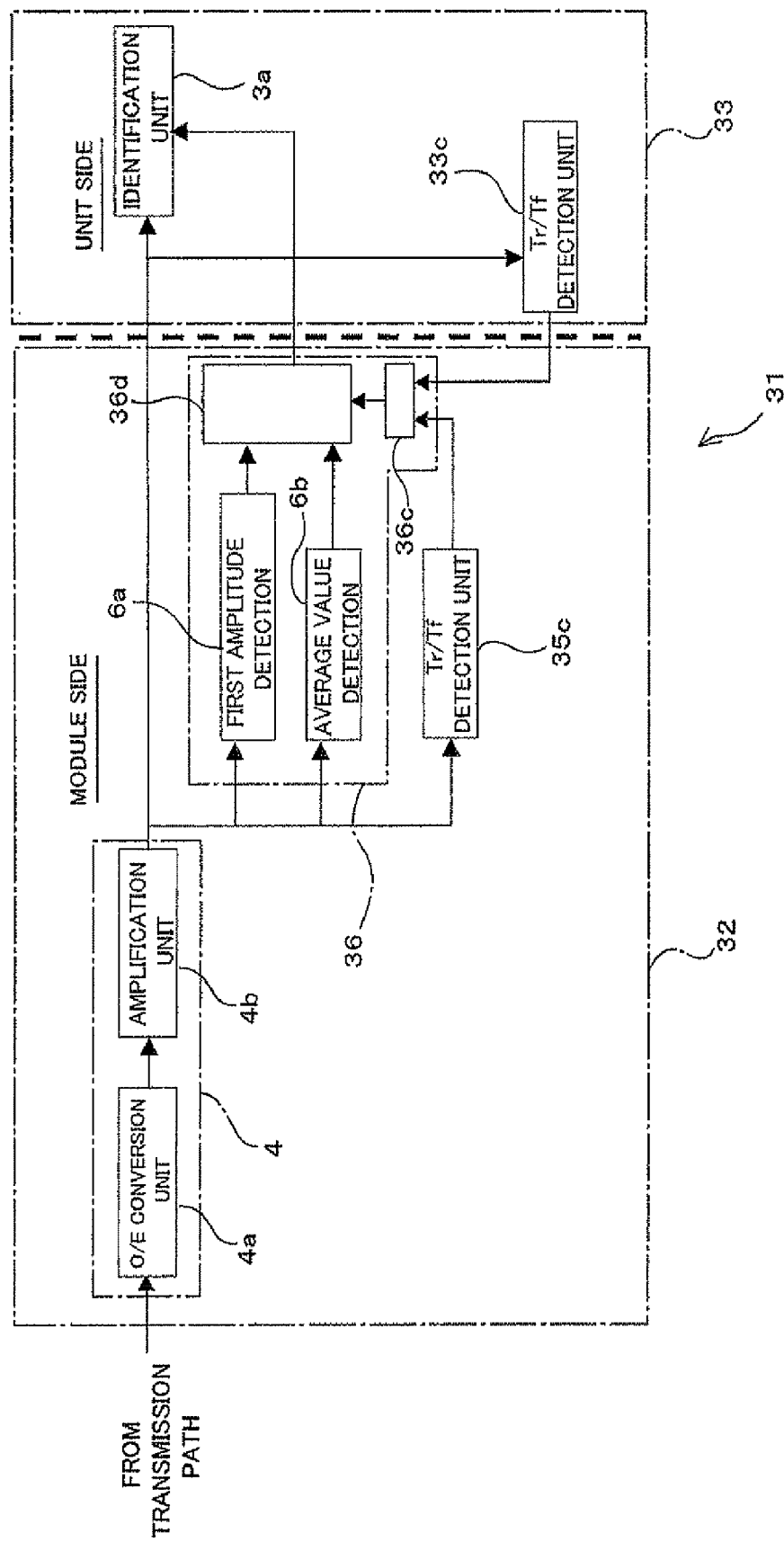
FIG. 7 illustrates an optical system according to the fourth embodiment.

FIG. 7 illustrates an optical system 31 according to the fourth embodiment. The optical system 31 illustrated in FIG. 7 includes an optical module 32 and a processing unit 33 different from those of the above described respective embodiments. The optical module 32 is configured as an optical reception module including the same optical reception unit 4 as that illustrated in FIG. 2 and a threshold calculation unit 36 different from that (see sign 6) illustrated in FIG. 2. A optical transmission and reception module may be configured by including the optical transmission unit 5 illustrated in FIG. 1.

The threshold calculation unit 36 includes the same first amplitude detection unit 6a and the average value detection unit 6b as those in the above described respective embodiments, and includes a signal path characteristic acquisition unit 36c and a calculation unit 36d different from those in the above described respective embodiments. The signal path characteristic acquisition unit 36c is the same as that of the third embodiment in that the unit 36c acquires a signal path characteristic of the reception signal path 7a by direct calculation, but uses different values from those of the third embodiment. The calculation unit 26d calculates the threshold value in the identification unit 3a based on the above described peak value and bottom value from the first amplitude detection unit 6a, average value detected from the average value detection unit 6b, and signal path characteristic acquired by the signal path characteristic acquisition unit 36c.

Further, the processing unit 33 includes the same identification unit 3a as that illustrated in FIG. 1 and includes a Tr/Tf detection unit 33c different from that (see sign 13c) illustrated in FIG. 4. The processing unit 33 may include the signal generation unit 3b illustrated in FIG. 1. In this case, the transmission electric signal from the signal generation unit 3b is input to the optical transmission unit 5 via the transmission signal path 7b (see FIG. 1). In FIG. 7, the same signs as those in FIG. 1 denote nearly the same parts.

Here, the Tr/Tf detection unit (the first rise and fall time detection unit) 33c detects the Tr/Tf time of the reception electric signal propagating the reception signal path 7a and being input to the identification unit 3a, i.e., the rise and fall time, and includes the basically same configuration as that illustrated in FIG. 5 (see signs 15c, 13c). Information of Tr/Tf time as a detection result is output to the signal path characteristic acquisition unit 36c forming the threshold calculation unit 36 of the optical module 32, which will be described later.

Further, the optical module 32 includes a Tr/Tf detection unit (the second rise and fall time detection unit) 35c detecting the Tr/Tf time of the reception electric signal from the optical reception unit 4, that is, the Tr/Tf time of the electric signal being input to the processing unit 3. Also, information of Tr/Tf time as a detection result in the Tr/Tf detection unit 35c is output to the signal path characteristic acquisition unit 36c.

In the signal path characteristic acquisition unit 36c, the ratio of the Tr/Tf time values from the above described Tr/Tf detection units 33c and 35c is directly derived as the signal path characteristic of the reception signal path 7a. In other words, the signal path characteristic acquisition unit 36c acquires the signal path characteristic by the calculation based on the detection results in the Tr/Tf detection units 33c and 35c.

Thereby, the calculation unit 36d calculates the threshold value using the identifier 3a forming the processing unit 33 according to the above described equation (1) based on the above described peak value/bottom value detected by the first amplitude detection unit 6a, average value detected by the average value detection unit 6b, and signal path characteristic acquired by the signal path characteristic acquisition unit 36c. Since the signal path characteristic acquired by the signal path characteristic acquisition unit 36c is based on the Tr/Tf time unlike the case of the third embodiment, and adjustment according to the characteristic value can be appropriately provided to the weighting factor M.

Also, in thus configured optical system 31 according to the fourth embodiment, there is an advantage that the threshold value when the unit 23 as the connection destination of the optical module 32 includes the identification unit 3a can be optimized.

[e] Others

Not limited to the above described embodiments, the various modifications are implementable.

Figure 8:
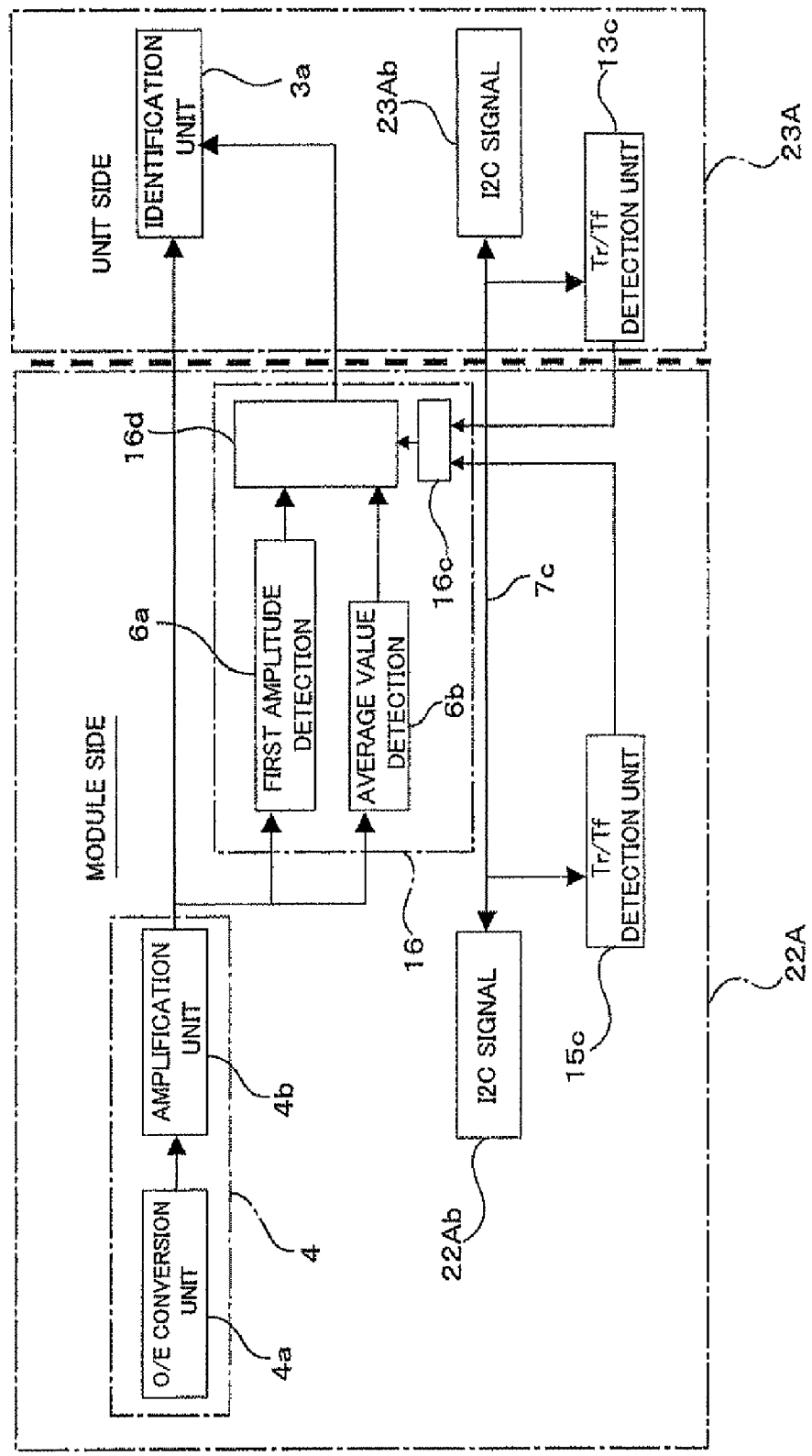
FIGS. 8 and 9 illustrate optical systems according to other embodiments.
Figure 9:
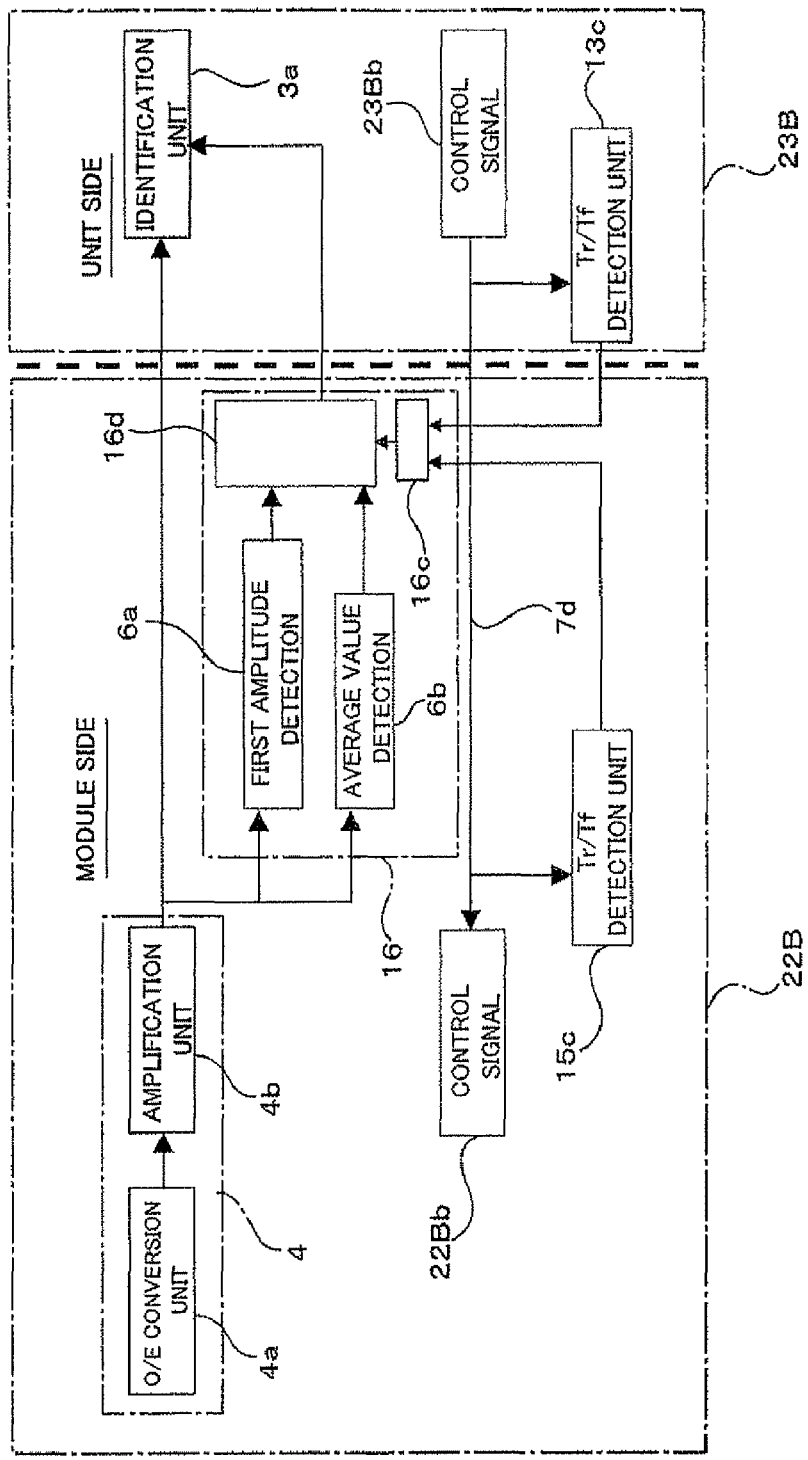

For instance, in the above described second embodiment, while the Tr/Tf detection unit 13c of the processing unit 13 detects the rise and fall time of the transmission electric signal as the main signal generated in the signal generation unit (transmission signal generation unit) 3b, the Tr/Tf detection unit 15c of the optical transmission and reception module 12 detects the rise and fall time of the transmission electric signals the main signal input to the optical transmission unit 5. According to the invention, not limited to that, rise and fall times may be respectively detected with respect to a monitor signal of the I2C signal in an I2C (I square C) signal line 7c in place of the main signal as illustrated in FIG. 8 and a control signal in an analog control signal line 7d as illustrated in FIG. 9. In FIGS. 8 and 9, the same signs as those in FIG. 4 denote nearly the same parts, and the transmission signal processing system (see signs 3b, 5) as the main signal is omitted to be illustrated.

Here, in the configuration illustrated in FIG. 8, the I2C signal output from an I2C signal processing unit (transmission signal generation unit) 23Ab provided in a processing unit 23A is input to an I2C signal processing unit 22Ab of an optical module 22A via the I2C signal line 7c. Tr/Tf times are respectively detected with respect to the I2C signals before propagation and after propagation via the IC signal line 7c by the Tr/Tf detection units 13c, 15c, and thereby, Tr/Tf time values may be obtained for deriving the signal path characteristic by the signal path characteristic acquisition unit 16c.

Similarly, in the configuration illustrated in FIG. 9, the analog control signal output from an control signal processing unit (transmission signal generation unit) 23Bb provided in a processing unit 23B is input to a control signal processing unit 22Bb of an optical module 22B via the analog control signal line 7d. Tr/Tf times are respectively detected with respect to the analog control signals before propagation and after propagation via the analog control signal line 7d by the Tr/Tf detection units 13c, 15c, and thereby, Tr/Tf time values may be obtained for deriving the signal path characteristic by the signal path characteristic acquisition unit 16c.

Further, in the cases of FIGS. 8 and 9, amplitude values before propagation and after propagation may be detected as parameters for deriving the signal path characteristic by the signal path characteristic acquisition unit.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention(s) has(have) been described in detail, it should be understood that the various changes, substitutions, and alterations could be made hereto without departing from the s

What is claimed is:

1. An optical system comprising:
    an optical module comprising an optical receiver that receives input light and output as an electric signal related to received input light; and
    a processor comprising an identifier that performs identification processing based on a threshold value on the electric signal input via a reception signal path from the optical receiver,
    wherein the optical module includes a threshold calculator that calculates the threshold value based on the electric signal from the optical receiver and a signal path characteristic of the reception signal path from the optical receiver to the identifier, and
    the identifier of the processor performs the identification processing based on the threshold value calculated by the threshold calculator.

2. The optical system according to claim 1, wherein the threshold calculator comprises:
    a first amplitude detector that detects an amplitude value of the electric signal from the optical receiver;
    an average value detector that detects an average value of the electric signal from the optical receiver;
    a signal path characteristic processor that acquires the signal path characteristic of the reception signal path; and
    a calculator that calculates the threshold value based on the amplitude value detected by the first amplitude detector, the average value detected by the average value detector, and the signal path characteristic calculated by the signal path characteristic processor.

3. The optical system according to claim 2, wherein the processor comprises a second amplitude detector that detects an amplitude of the electric signal input to the identifier, and
    the signal path characteristic processor acquires the signal path characteristic by calculation based on detection results in the first and second amplitude detectors.

4. The optical system according to claim 2, wherein the processor comprises a first rise and fall time detector that detects rise and fall time of the electric signal input to the identifier,
    the optical module includes a second rise and fall time detector that detects rise and fall time of the electric signal from the optical receiver, and
    the signal path characteristic processor acquires the signal path characteristic by calculation based on detection results in the first and second rise and fall time detectors.

5. The optical system according to claim 2, wherein the processor comprises a transmission signal generator that generates a transmission electric signal and a third amplitude detector that detects an amplitude of the transmission electric signal generated by the transmission signal generator,
    the optical module comprises an optical transmitter that converts the transmission electric signal from the transmission signal generator into a transmission optical signal and outputs the transmission optical signal, and a fourth amplitude detector that detects an amplitude with respect to the transmission electric signal input to the optical transmitter, and
    the signal path characteristic processor acquires the signal path characteristic by calculation based on detection results in the third and fourth amplitude detector.

6. The optical system according to claim 2, wherein the processor includes a transmission signal generator that generates a transmission electric signal and a third rise and fall time detector that detects rise and fall time of the transmission electric signal generated by the transmission signal generator, the optical module includes an optical transmitter that converts the transmission electric signal from the transmission signal generator into a transmission optical signal and outputs the transmission optical signal, and a fourth rise and fall time detector that detects rise and fall time with respect to the transmission electric signal input to the optical transmitter, and the signal path characteristic processor acquires the signal path characteristic by calculation based on detection results in the third and fourth rise and fall time detector.

7. The optical system according to claim 5, wherein the transmission electric signal generated by the transmission signal generator is a main signal.

8. The optical system according to claim 6, wherein the transmission electric signal generated by the transmission signal generator is a main signal.

9. The optical system according to claim 5, wherein the transmission electric signal generated by the transmission signal generator is a monitor signal.

10. The optical system according to claim 6, wherein the transmission electric signal generated by the transmission signal generator is a monitor signal.

11. The optical system according to claim 5, wherein the transmission electric signal generated by the transmission signal generator is a control signal.

12. The optical system according to claim 6, wherein the transmission electric signal generated by the transmission signal generator is a control signal.

13. The optical system according to claim 1, wherein the optical receiver comprises a photoelectric converter that converts the input light into an electric signal and an amplifier that amplifies the output of the photoelectric converter.

14. The optical system according to claim 1, wherein the optical module and the processor are compliant with MSA (Multi-Source Agreement).

15. An optical module in an optical system including an optical module and a processor connected to the optical module, comprising:
   an optical receiver that receives input light and output an electric signal related to received input light; and
   a threshold calculator that calculates the threshold value for identification processing based on the electric signal from the optical receiver and a signal path characteristic of a reception signal path between the optical module and the processor.

16. A threshold setting method in an optical system comprising an optical module having an optical receiver that receives input light and output an electric signal related to received input light, and a processor comprising an identifier that performs identification processing on the electric signal from the optical receiver based on a threshold value, the threshold setting method comprising:
   detecting a characteristic of the electric signal from the optical receiver in the optical module;
   acquiring a signal path characteristic of a reception signal path from the optical receiver to the identifier; and
   calculating the threshold value for identification processing in the identifier based on the detected characteristic of the electric signal and the acquired signal path characteristic.

* * * * *